United States Patent [19]
Macomber

[11] Patent Number: 5,442,650
[45] Date of Patent: Aug. 15, 1995

[54] DISTRIBUTED TALBOT FILTER SURFACE-EMITTING DISTRIBUTED FEEDBACK LASER

[75] Inventor: Steven H. Macomber, Bethel, Conn.

[73] Assignee: Hughes Aircraft Company, Los Angeles, Calif.

[21] Appl. No.: 112,825

[22] Filed: Aug. 26, 1993

[51] Int. Cl.$^6$ ............................................. H01S 3/10
[52] U.S. Cl. ...................................... 372/96; 372/50
[58] Field of Search ................... 372/96, 50, 92, 108

[56] References Cited

U.S. PATENT DOCUMENTS 5,241,556  8/1993  Macomber et al. ................ 372/96

Primary Examiner—James W. Davie
Attorney, Agent, or Firm—Michael W. Sales; Wanda K. Denson-Low

[57] ABSTRACT

A surface-emitting distributed Talbot filter laser that provides for radiation of energy in in-phase radiating modes to produce improved beam quality. The distributed Talbot filter laser of the present invention comprises a plurality of sets of parallel stripe contacts, wherein adjacent parallel sets of parallel stripe contacts are offset from each other. The laser may optionally employ a phase corrector for reducing sidelobe energy. In addition, the plurality of stripe contacts may each have a relatively large stripe width to increase a near-field fill factor of the laser and thereby reduce sidelobe energy. The gain profile of the laser is patterned using the offset stripe contact design, such that the stripe pattern matches the intensity profile of the preferred in-phase mode. The stripe pattern is comprised of offset parallel arrays of stripes spaced apart by a distance D and having length $\bar{n}D^2/\lambda$, wherein $\bar{n}$ is the effective index of refraction and $\lambda$ is the wavelength of the laser radiation in a vacuum. The in-phase radiating mode has a central far-field lobe located on-axis, resulting in a higher radiance laser.

9 Claims, 9 Drawing Sheets

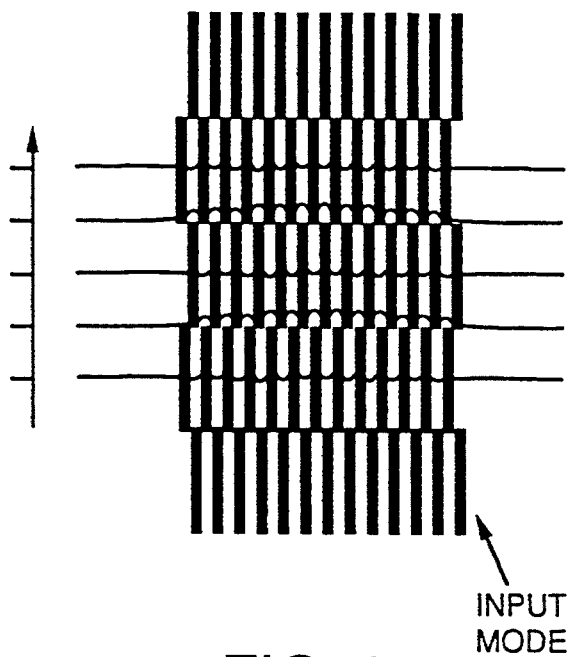
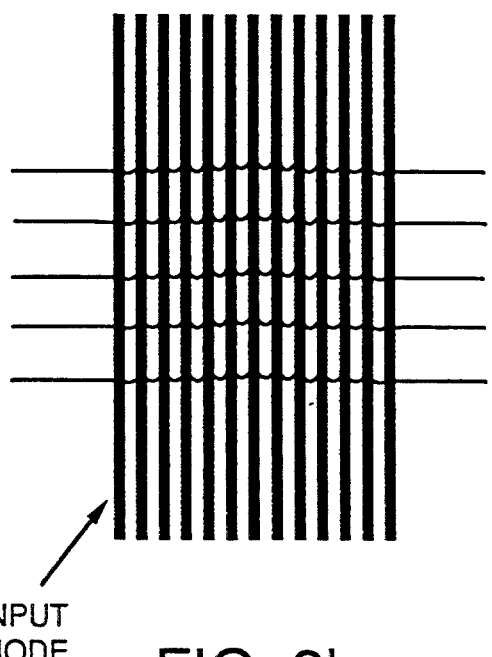
INPUT MODE      INPUT MODE
FIG. 3a.        FIG. 3b.
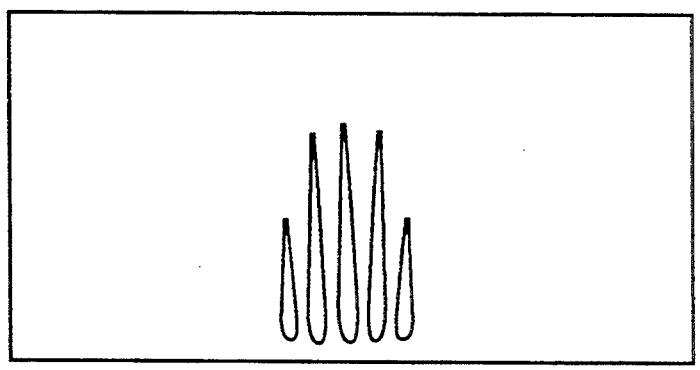
FIG. 4a.
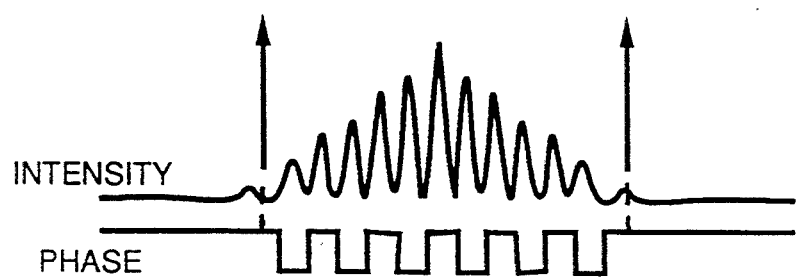
FIG. 4b.
INTENSITY
PHASE

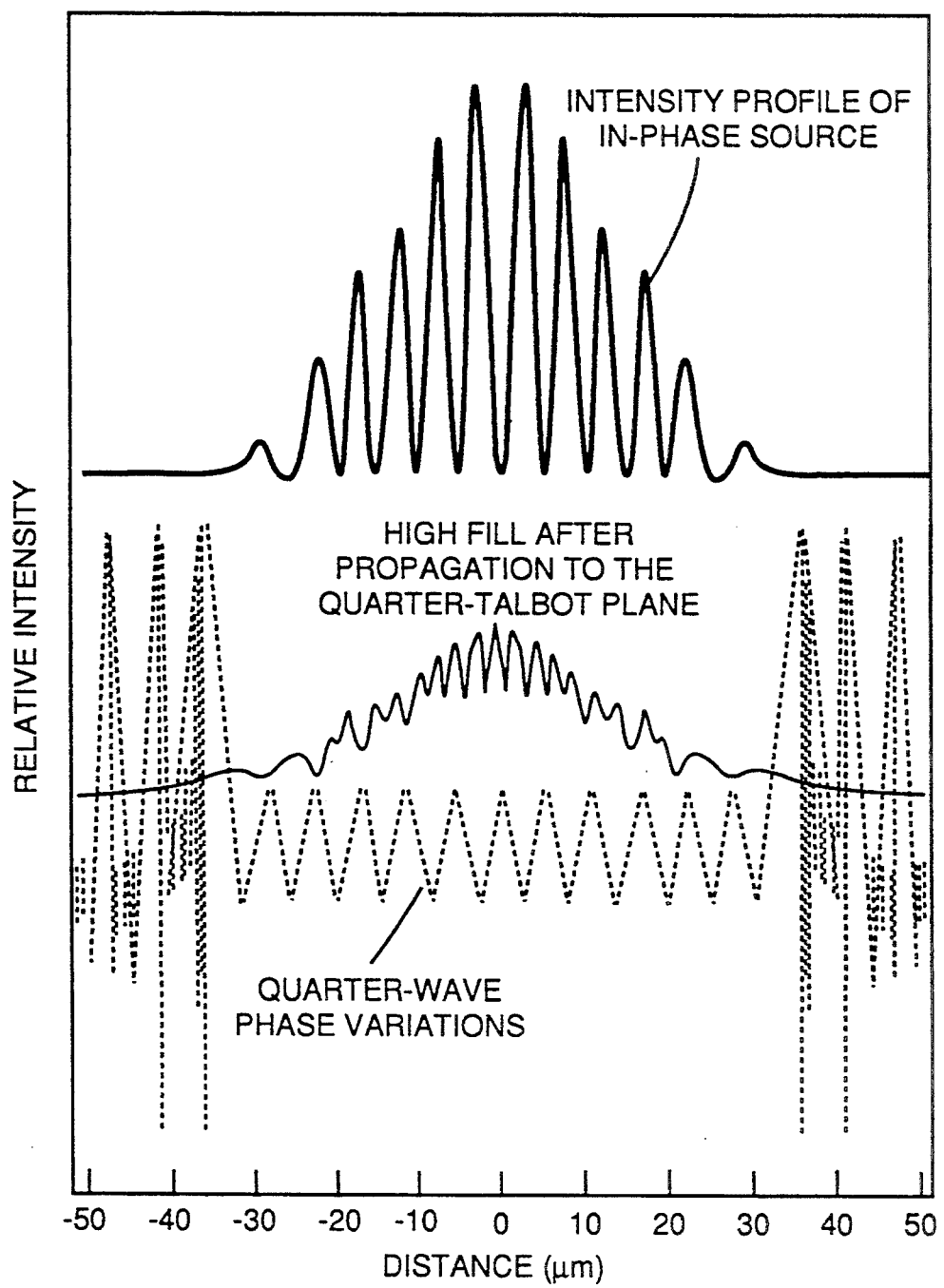

DISTRIBUTED TALBOT FILTER SURFACE-EMITTING DISTRIBUTED FEEDBACK LASER

BACKGROUND

The present invention relates generally to lasers, and more particularly, to a distributed Talbot filter surface-emitting distributed feedback (DFB) laser that provides for radiation of in-phase energy modes.

There has been much interest in monolithic two-dimensional arrays of surface emitting diode lasers in recent years. Arrays using etched 45 degree mirrors and distributed Bragg reflector designs have been demonstrated that produced several watts of output power. For the most part, these arrays had to be operated in the pulsed mode due to high thermal resistance from a p-side up bonding configuration and the absence of effective heat sinking. Many applications of two-dimensional arrays will require either continuous wave (CW) or high duty cycle operation.

Recent publications have described how silicon microchannel heat sinks may be applied to both non-monolithic and monolithic arrays for CW operation. Arrays of surface emitting distributed feedback (SEDFB) lasers, in particular, offer the promise of reliable high-power CW operation due to their p-side down design.

When designing and constructing any laser, it is normally a design objective to provide for a laser that has relatively good far-field beam quality. Ideally, it is desirable to produce a laser that produces a single-lobed far-field beam pattern having a width comprised of only diffraction spreading. In general, diode lasers do not operate in this manner. Much of the research over the last 20 years relating to high power diode lasers has focused on designing and constructing arrays of lasers that produce improved far-field beam patterns.

Conventional semiconductor laser arrays employ a straight line stripe pattern. This stripe pattern is somewhat disadvantageous because undesirable out-of-phase radiating modes are produced by the laser array. However, it is more desirable to have an array that produces a preferred in-phase radiating mode, which results in a more desirable single-lobed far-field beam pattern.

Therefore, it is an objective of the present invention to provide a surface-emitting distributed feedback semiconductor laser that radiates energy in in-phase radiating modes.

SUMMARY OF THE INVENTION

In order to meet the above and other objectives, the present invention comprises a surface-emitting distributed Talbot filter semiconductor laser that provides for radiation of energy in in-phase radiating modes. The distributed Talbot filter laser of the present invention comprises a conventional distributed Talbot filter laser array, wherein the improvement is a Talbot filter that is comprised of a plurality of sets of parallel stripe contacts, wherein adjacent parallel sets of parallel stripe contacts are offset from each other.

More particularly, the surface emitting distributed feedback semiconductor laser of the present invention comprises a negatively-doped semiconductor material substrate, and a plurality of semiconductor material layers disposed on the substrate. A grating is etched into a selected semiconductor material layer. A Talbot spatial filter array comprising a plurality of sets of parallel stripe contacts is disposed over the grating, wherein adjacent parallel sets of parallel stripe contacts are offset from each other. A plurality of ohmic contacts are formed in the substrate, and an output window etched into the substrate. Each stripe contact of the plurality of sets of parallel offset stripe contacts may be generally comprised of diffused zinc pattern.

The distributed Talbot filter laser may optionally further comprise a transmissive phase corrector disposed along the output path of the output energy beam radiated by the laser, which is adapted to reduce sidelobe energy. In addition, the plurality of stripe contacts may each have a relatively large stripe width to increase near-field fill factor of the laser and thereby reduce sidelobe energy.

The key to the present invention is to pattern the gain profile of the laser, using the offset stripe contact design, such that the stripe pattern matches the intensity profile of the preferred in-phase mode of the semiconductor laser array. In particular, the stripe pattern comprised of offset parallel arrays of stripes having center-to-center spacing D and having length $\bar{n}D^2/\lambda$ achieves this goal, wherein $\bar{n}$ is the effective index of refraction and $\lambda$ is the wavelength of the laser radiation in a vacuum.

The distributed Talbot filter laser of the present invention selects and radiates the preferred in-phase radiating mode. The in-phase radiating mode has a central far-field lobe located on-axis whereas the out-of-phase radiating mode has two off-axis far-field lobes. The present invention therefore provides a higher radiance laser.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIGS. 1c and 1d basic radiating modes of the distributed Talbot filter laser of FIG. 1a;

FIGS. 3a and 3b illustrate propagation of in-phase and out-of-phase modes, respectively, inside a two dimensional planar waveguide;

FIG. 8 shows a simulated quarter plane Talbot image produced by the distributed Talbot spatial filter employed in the present invention;

DETAILED DESCRIPTION

Figure 1A:
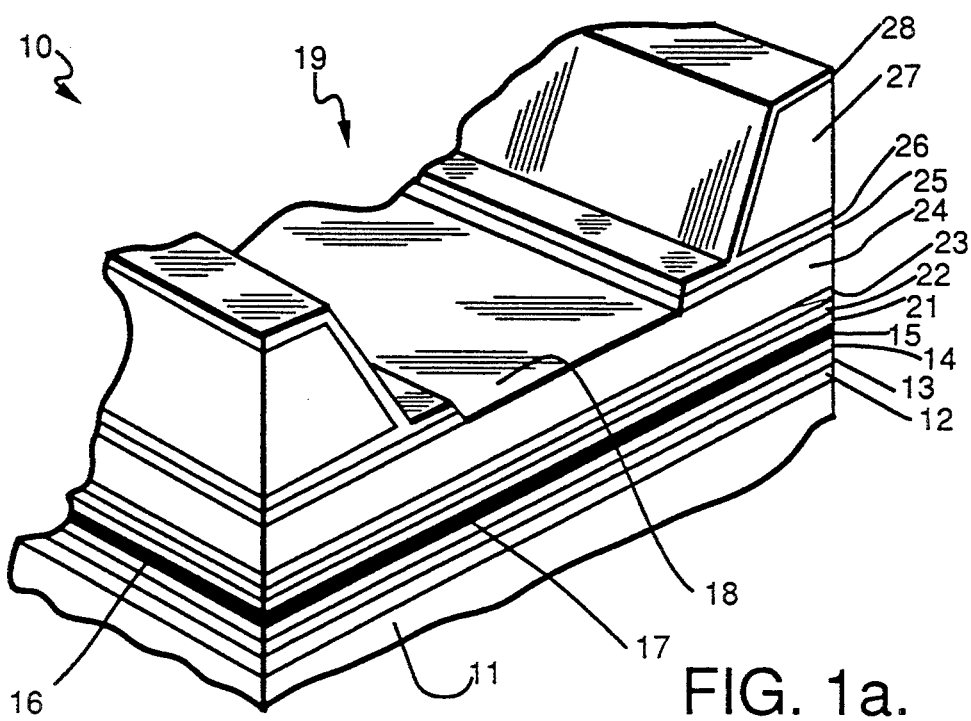
FIG. 1a shows a perspective partial view of a portion of a conventional distributed Talbot filter laser illustrating its structure.

Referring to the drawing figures, FIG. 1a shows a perspective partial view of a portion of an integrated circuit distributed Talbot filter laser 10 illustrating its structure. The distributed Talbot filter laser 10 is comprised of a heat sink 11 on top of which is disposed a plurality of layers of material as follows. A layer of gold (Au) 12 is disposed on the heat sink 11. A layer of platinum (Pt) 13 is disposed on the layer of gold 12. A layer of chromium (Cr) 14 is disposed on the layer of platinum 13. A gallium arsenide (GaAs) layer 15 is disposed on the layer of chromium 14. A grating 16 is formed in the gallium arsenide layer 15, and a gold contact 17 is formed in the gallium arsenide layer 15 adjacent an area of an output window 18 that is subsequently formed.

A p-type cladding layer 21 is disposed over the gallium arsenide layer 15 and gold contact 17. An active layer 22 is disposed over the p-type cladding layer 21. An n-type confinement layer 23 is disposed over the active layer 22. An n-type cladding layer 24 is disposed over the n-type confinement layer 23. An n-type GaAs layer 25 is disposed over the n-type cladding layer 24. A stop etch layer 26 is disposed over the n-type GaAs layer 25 which is used to form the output window 18. An n-type GaAs layer 27 is disposed over the stop etch layer 26. Finally, a gold-germanium-nickel (Au-Ge-Ni) layer 28 is disposed over the n-type GaAs layer 27. The output window 18 is disposed at the bottom of an etched well 19. The design and construction of the integrated circuit distributed Talbot filter laser 10 is well-known in the art and will not be further described herein except for the improvements provided by the present invention.

Figure 1B:
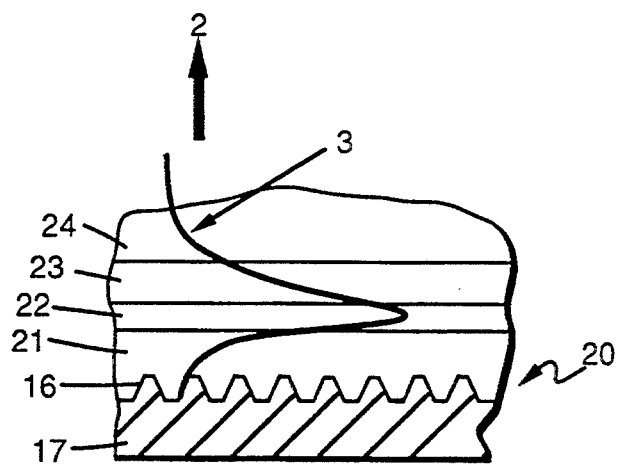
FIG. 1b shows a side view of the distributed Talbot filter laser of FIG. 1a illustrating the waveguide intensity profile of the output beam therefrom.

FIG. 1b shows a side view of the distributed Talbot filter laser 10 of FIG. 1a illustrating a waveguide intensity profile 2 of its output beam 3. The integrated circuit distributed Talbot filter laser 10 is typically about 3 millimeters long and 0.6 millimeters wide. The grating periodicity of the grating 16 foraged in the distributed Talbot filter laser 10 is approximately 0.25 microns, whereas the waveguide mode is about 1 micron across. The output window 18 formed at the bottom of the etched well 19 is as wide as the stripe pattern, typically about 100 microns. The n-cladding layer 24 is about 20-30 microns thick.

One key feature of the surface-emitting distributed feedback laser 10 is the holographically generated second-order grating 16 that is etched into the surface of the p-cladding layer 21, and which typically has a 0.24 $\mu$m period. The p-cladding layer is very thin (approximately 0.40 $\mu$m) so that the waveguide mode has some overlap in the grating 16. One grating order diffracts lights into a surface normal direction for the output beam. A second grating order diffracts the waveguide mode backwards along the waveguide to provide for feedback. The surface of the grating 16 is typically coated with gold to provide high diffraction efficiency and to eliminate losses from downward propagating orders typically encountered in dielectric grating devices. The gold/grating surface also serves as a p-side ohmic contact. The n-side ohmic contact is provided by the Au-Ge-Ni layer 28. The well 19 is chemically etched into the n-type GaAs layer 27 (the p-side of the laser) to remove the GaAs substrate material, allowing surface diffracted radiation to exit the laser 10. This configuration permits p-side down bonding to the heat sink 11 to provides for low device thermal resistance.

Figure 1C:
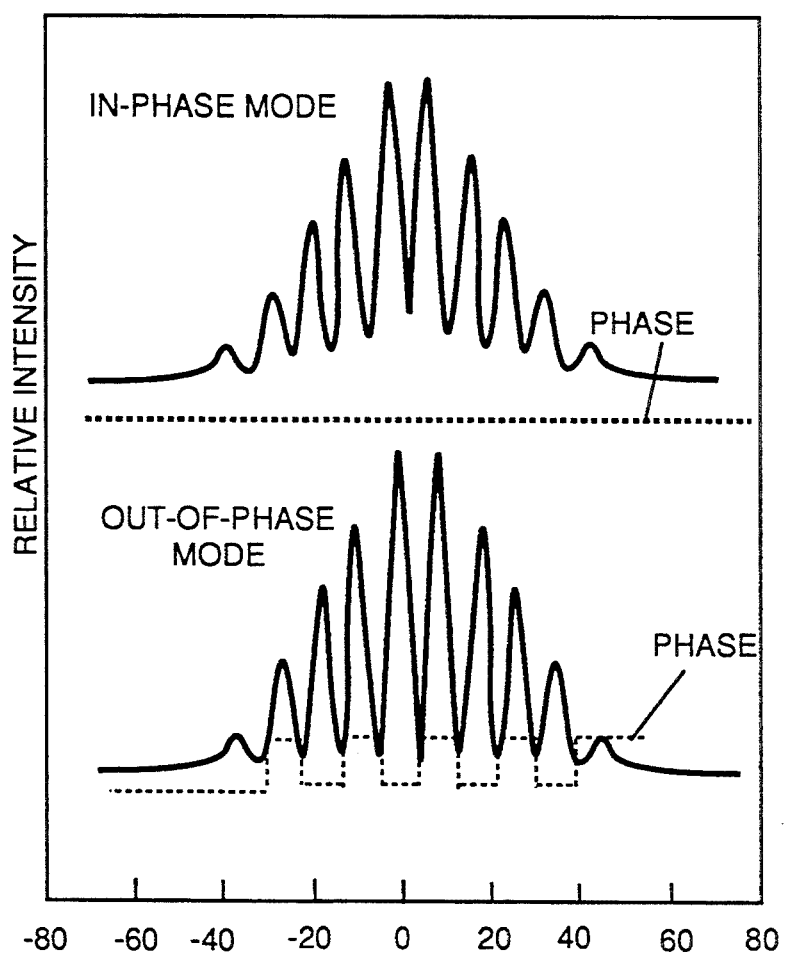
Figure 1D:
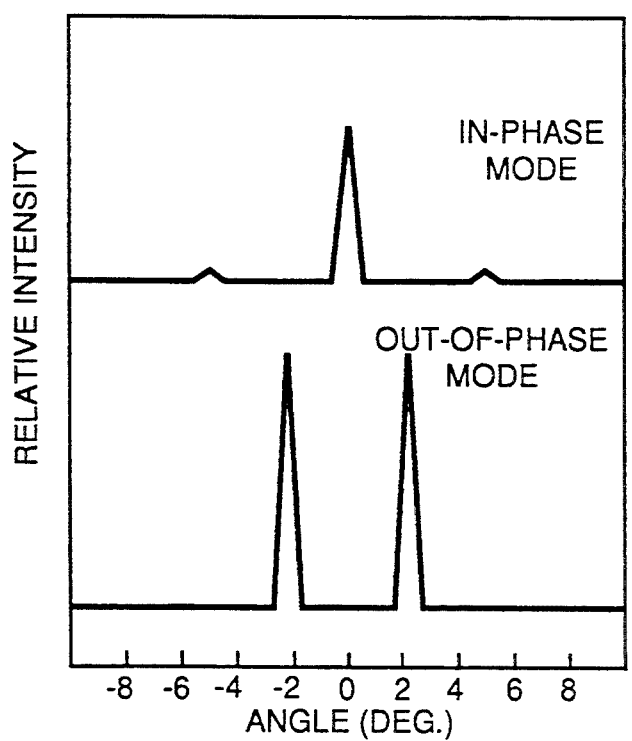

FIGS. 1c and 1d illustrate basic radiating modes of the distributed Talbot filter laser of FIG. 1a. These basic radiating modes include in-phase and out-of-phase modes, and near-field (FIG. 1c) and far-field (FIG. 1d) profiles for the two modes. There are at least N modes for an N-stripe laser 10, but typically the two extreme-case modes discussed herein are dominant. The intensity patterns of the two dominant modes are very similar but their phase profiles are not. The difference between these modes shows up most dramatically in the far-field. The in-phase mode produces a central on-axis lobe in the far-field, whereas the out-of-phase mode produces no central far-field lobe.

Figure 2:
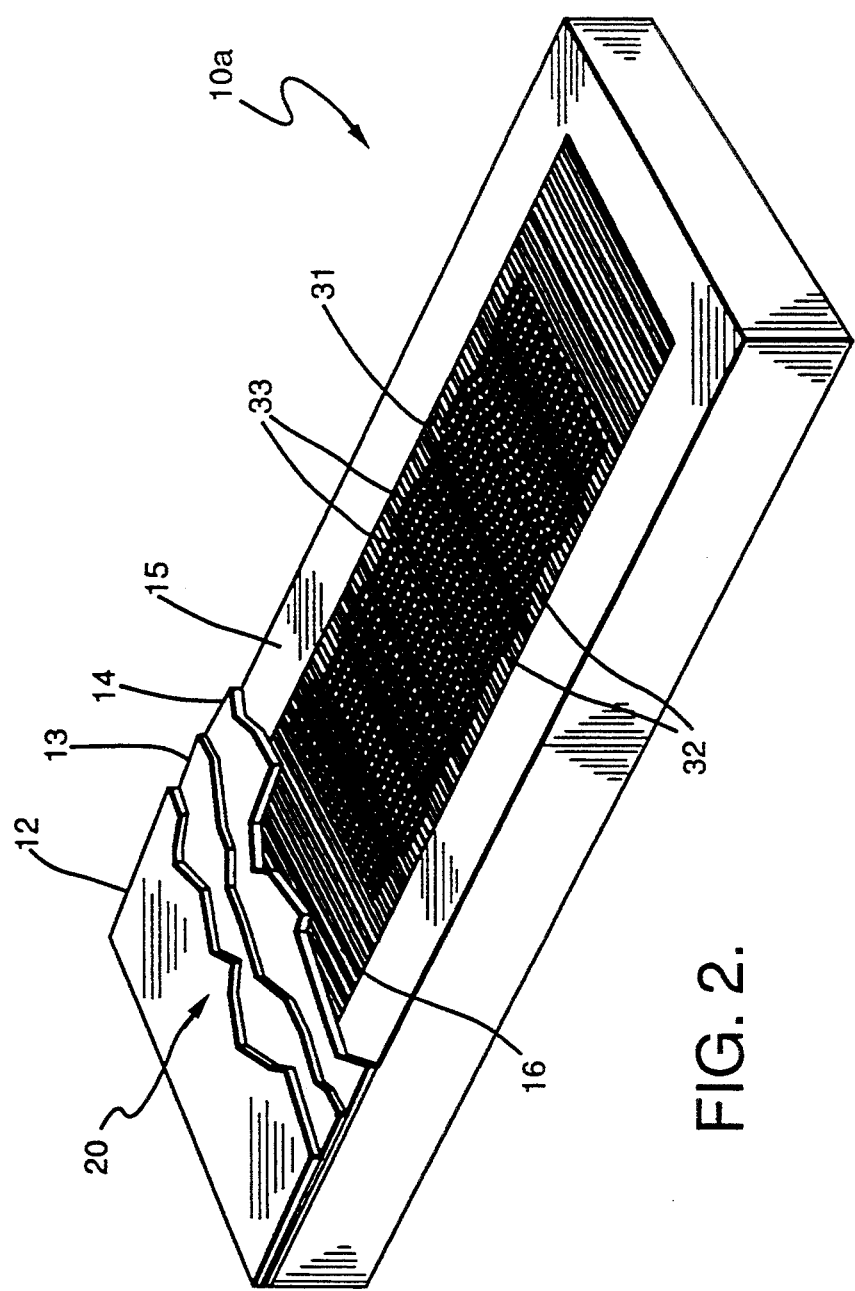
FIG. 2 shows a partially cutaway bottom view of a distributed Talbot filter laser in accordance with one embodiment of the present invention.

Given the foregoing, FIG. 2 shows a partially cutaway bottom view of a distributed Talbot spatial filter laser 10a in accordance with one embodiment of the present invention. The present distributed Talbot filter laser 10a has a zinc-diffused pattern 31 comprising a plurality of sets of offset stripe contacts 32 in accordance with the principles of the present invention. The plurality of sets of offset stripe contacts 32 form a waveguide 20. The plurality of sets of parallel offset stripe contacts 32 may be provided by diffusing zinc into the surface of the GaAs layer 15. Spatial mode filtering occurs everywhere inside the distributed Talbot filter laser 10a.

FIG. 2 also shows the design of the plurality of sets of stripe contacts 13 for the distributed. Talbot filter laser 10a that was reduced to practice. The patterning was accomplished using an oxide mask and then diffusing zinc into the surface of the GaAs layer 15 to provide for a patterned gain profile. The individual stripe contacts 33 of the plurality of sets of stripe contacts 32 are typically 2-4 microns in width on 7 micron centers (i.e. D=7 microns). There may typically be 15 stripe contacts 33 per set of parallel stripe contacts 32, each having a length of about 190 microns. The undiffused lateral portions of the GaAs layer 15 that lies outside the sets of parallel stripe contacts 32 are approximately 400 microns in length. Opposite ends of the GaAs layer 15 outside the undiffused portions are approximately 300 microns in length. The total size of the distributed Talbot filter laser 10a is approximately 2900 microns in length by 400 microns in width. The above characteristics of the distributed Talbot filter laser 10a are provided for the purpose of illustration, and it is to be understood that the present invention may employ other designs that produce more optimized results.

Figure 9:
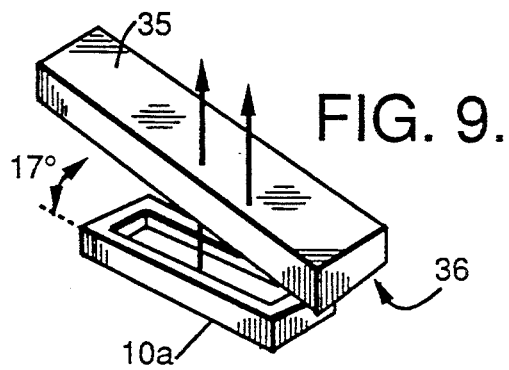
FIG. 9 illustrates an enhancement to the present invention employing a tilted phase corrector.

FIGS. 3-8 and 10 present simulation and test data that was generated in developing the distributed Talbot filter laser 10 of the present invention, and is provided for the purpose of completeness. FIG. 9 illustrates an enhancement to the present laser 10 employing a tilted phase corrector.

FIGS. 3a and 3b illustrate propagation of in-phase and out-of-phase modes, respectively, inside a two-dimensional planar waveguide. The sets of curves in FIGS. 3a and 3b are found by Fresnel propagating an input mode (shown at the bottom of each set of curves in FIGS. 3a and 3b), and displaying it every quarter Talbot plane, where the Talbot distance $Z_T = 2\bar{n}D^2/\lambda$, and where $\bar{n}$ is the reflection index of the waveguide, D is the spacing between adjacent stripe contacts 33, and $\lambda$ is the radiated wavelength of the laser 10 in a vacuum.

The intensity profile of the in-phase modes is closest to that produced by an offset stripe pattern, such as is provided by the present laser 10a. In contrast, the out-of-phase modes propagates along straight lines. In accordance with the teachings of the present invention, the patterns shown in FIGS. 3a and 3b also correspond to stripe contact patterns that generates a laser gain pattern that preferentially amplifies a given mode. If the out-of-phase mode is to be selected, a straight stripe pattern is used, whereas, an offset pattern selects the in-phase mode.

Figure 4D:
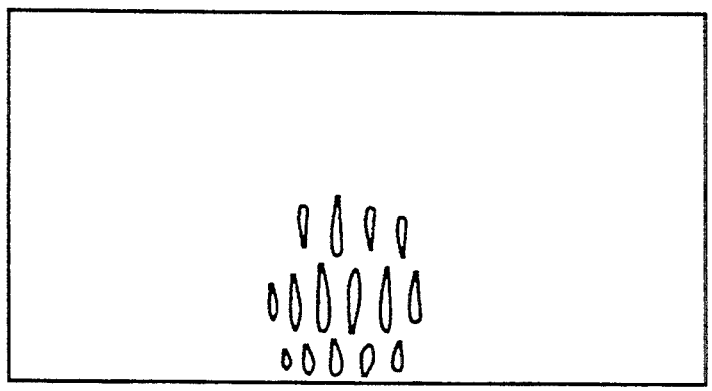
FIGS. 4a and 4b illustrate results of a computer simulation of the propagation of an input wavefront intensity and phase profile, respectively, that is numerically propagated in an otherwise lossless planar waveguide in two dimensions.
Figure 4C:
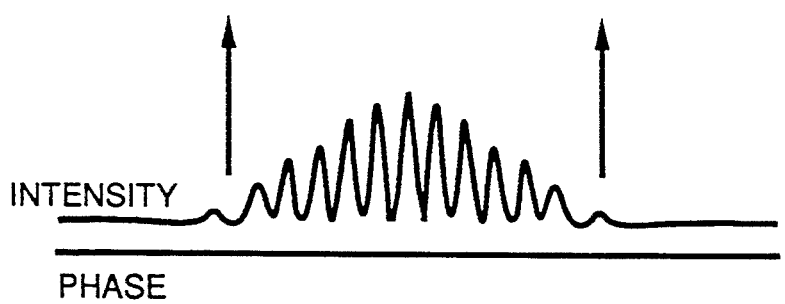

FIGS. 4a, 4b, 4c, and 4d illustrate results of a computer simulation (FIGS. 4a and 4c) of the propagation of an input wavefront intensity and phase profile (FIGS. 4b and 4d) respectively, that is numerically propagated in an otherwise lossless planar waveguide in two dimensions. The plots, (FIGS. 4b and 4d, show the intensity of the wave field as it propagates along the two dimensional waveguide. Two different input intensity and phase profiles are shown, one for the in-phase mode (FIG. 4d) and one for the out-of-phase mode (FIG. 4b). These results imply that to achieve the in-phase mode, an offset stripe pattern is used as in the present laser 10a, whereas if the out-of-phase mode is desired, the straight line stripe pattern is used.

Figure 5A:
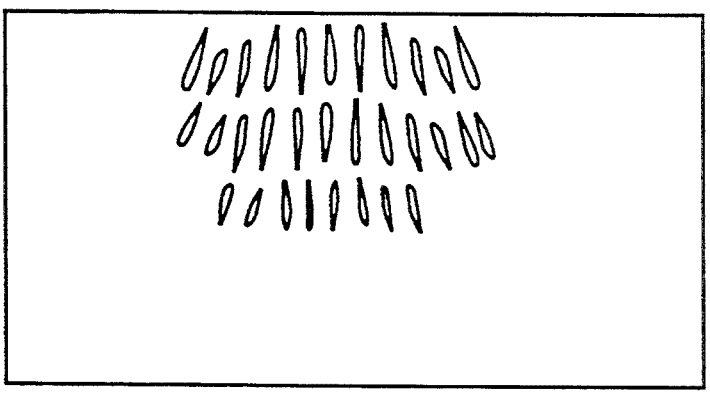
FIGS. 5a and 5b show the results of a computer simulation and illustrate the propagation of the in-phase mode in the waveguide with gain and anti-guiding turned on in the distributed Talbot filter laser of FIG. 2.
Figure 5B:
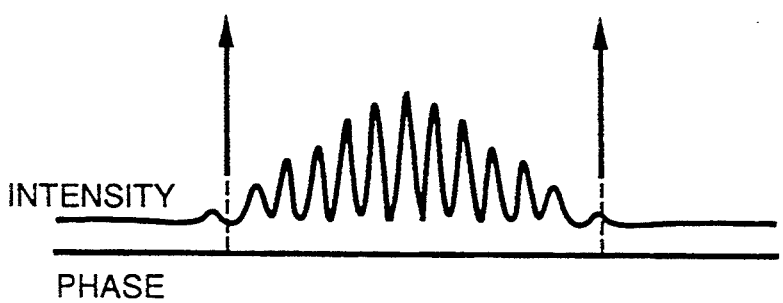

FIGS. 5a and 5b shows the results of a computer simulation and illustrate the propagation of the in-phase mode in the waveguide 20 with gain and anti-guiding turned on in the distributed Talbot filter laser 10a of FIG. 2. The Zn-diffusion pattern 31 used to calculate the excited carrier profile corresponds to the pattern of the plurality of sets of stripe contacts 31 employed in the laser 10a shown in FIG. 2. This result shows that the character of the way in which the in-phase mode propagates still holds when there is strong gain and anti-guiding in the waveguide 20 of the the distributed Talbot filter laser 10a.

Figure 6A:
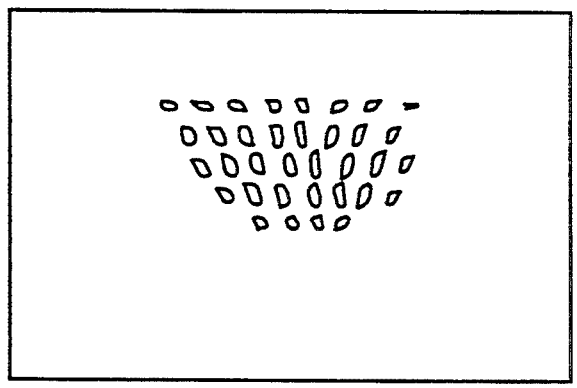
FIGS. 6a and 6b show the calculated near field intensity and phase, respectively, from a computer simulation of the distributed Talbot filter laser of in the present invention.
Figure 6B:
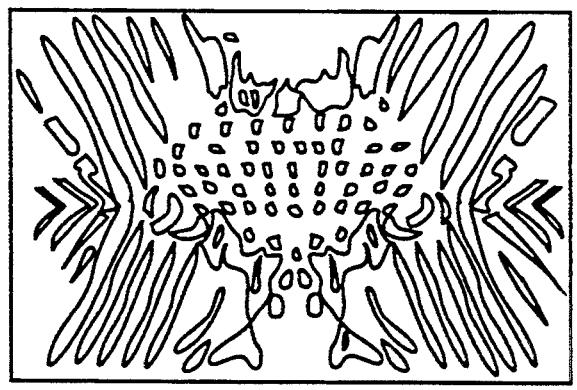

FIGS. 6a and 6b show the calculated near field intensity (amplitude) and phase, respectively, from a computer simulation of the distributed Talbot filter laser 10a of the present invention.

Figure 7A:
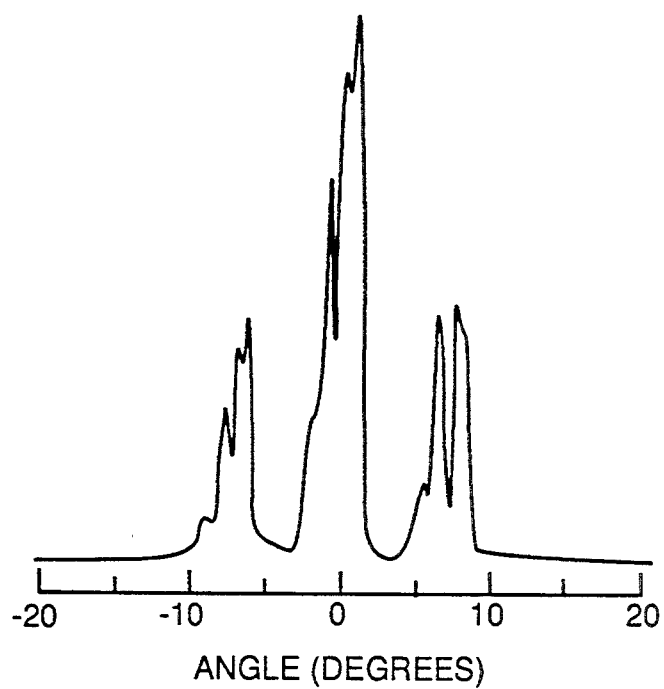
FIGS. 7a and 7b show the calculated lateral and longitudinal mode far fields, respectively, from the computer simulation of the distributed Talbot filter laser of the present invention.
Figure 7B:
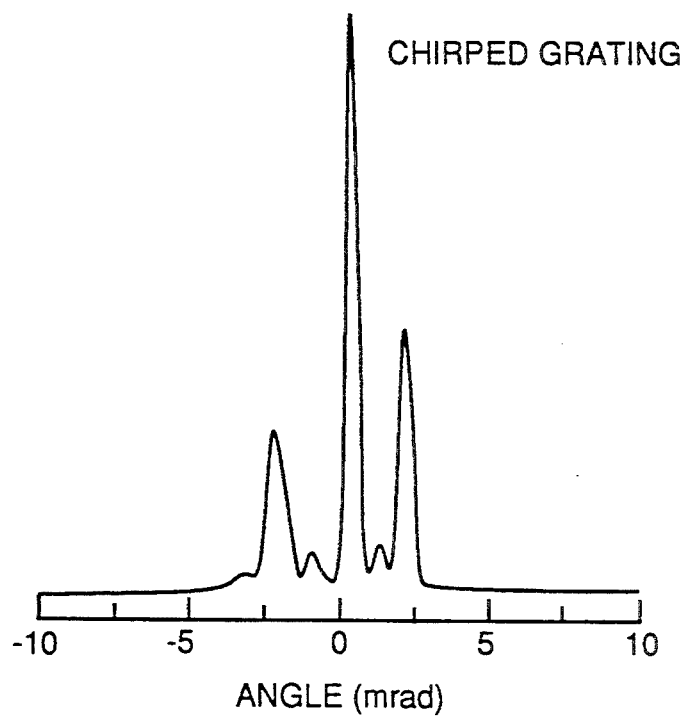

FIGS. 7a and 7b show the calculated lateral and longitudinal mode far fields, respectively, from a computer simulation of the distributed Talbot filter laser 10a of the present invention. Both the lateral and longitudinal mode far fields have undesirable side lobes. This is corrected by using a phase corrector 35 as will be discussed with reference to FIG. 9 below.

FIG. 8 shows a simulated quarter plane Talbot image produced by the distributed Talbot spatial filter laser 10a of the present invention. The quarter plane Talbot image, found from numerical Fresnel propagation of an in-phase source, has twice the spatial frequency of the original image and has a high fill factor. The phase varies by one-quarter of a wavelength between alternate intensity lobes. If the quarter wave phase shifts are removed (corrected) then the corresponding far field has weak side lobes. This correction is implemented as is shown in FIG. 9.

The present laser 10 may further include phase correction optics comprising the phase corrector 35 disposed along an optical path of the laser output beam to decrease sidelobe energy produced by the laser 10a. In the alternative, a larger stripe width may be used to increase the near-field fill factor and thereby reduce the far-field sidelobe energy. FIG. 9 illustrates an enhancement to the present invention employing the tilted phase corrector 35. FIG. 9 illustrates that the Talbot distance is smaller in air than in the waveguide 20 by a factor of the effective index of the waveguide 20 given by $\bar{n} \sim 3.4$. Fresnel propagation occurs simultaneously in the waveguide 20 and in the surface emitted output laser beam in air. The quarter-plane distance is $n\, D^2/2\lambda$, in the waveguide 20 and $D^2/2\lambda$ in air. Thus, there is a plane in front of the laser 10a that is tilted longitudinally at an angle $\theta \sim 17°$ where $\tan(\theta) = 1/\bar{n}$ for which the entire two-dimensional image has a constant quarter-Talbot plane profile. Placing the tilted phase corrector 35 at this plane reduces the sidelobe energy in the far field. The phase corrector 35 is comprised of a series of straight stripe contacts 36 having the same center to center spacing as the stripe contacts 33 of the laser 10a and having quarter-wave relative phase shifts. The depth of the phase corrector 35 is given by $$t = \frac{\lambda}{4(n_c - 1)}$$

where $n_c$ is the index of refraction of the material (glass or fused silica) from which the phase corrector 35 is fabricated.

Figure 10A:
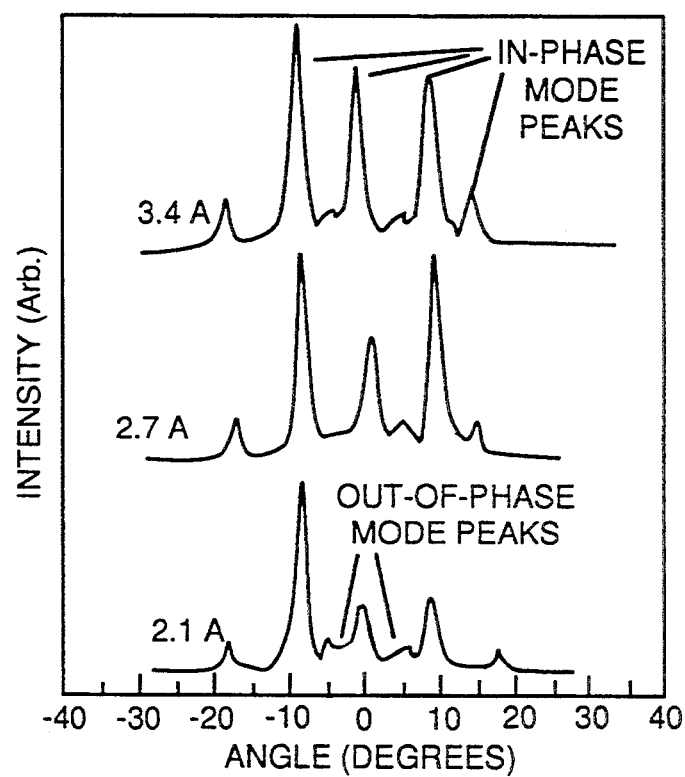
FIGS. 10a and 10b show the lateral far-field and longitudinal far-field energy output data, respectively, from a distributed Talbot filter laser of the present invention that was reduced to practice.
Figure 10B:
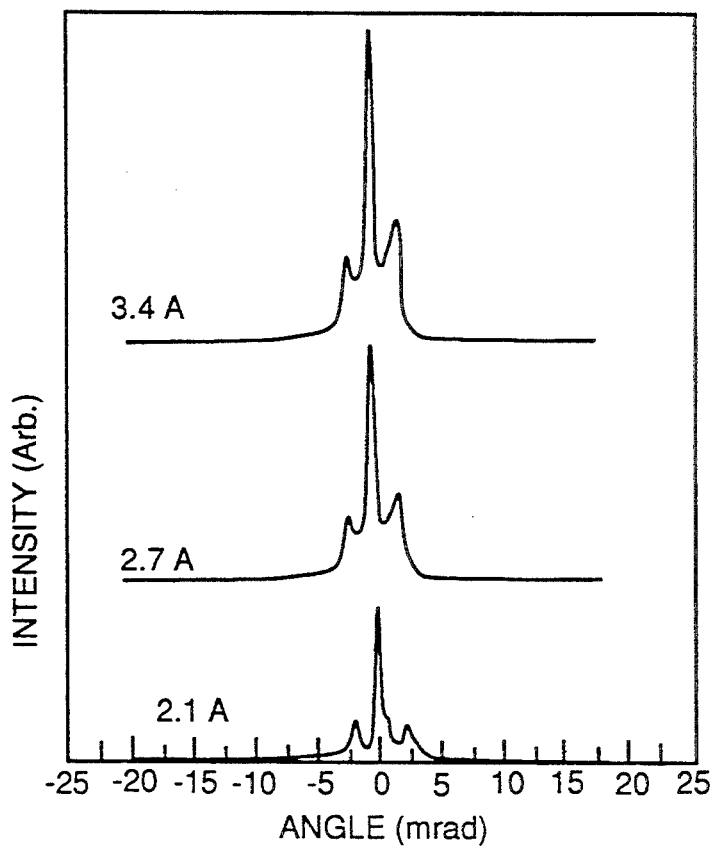

FIGS. 10a and 10b show the lateral far-field and longitudinal far-field energy output, respectively, for the distributed Talbot filter laser 10a in accordance with the principles of the present invention that was reduced to practice. Several lobes are observed. The strong lobes are associated with the in-phase mode. The lobes associated with the out-of-phase mode are much weaker.

Applications for the distributed Talbot filter surface-emitting DFB laser 10 of the present invention include imaging laser radars, active seekers for missiles, free-space laser communication devices, laser micro-welders, laser systems adapted to treat gum disease, and imaging laser radars that provide for remote control of vehicles in hazardous environments.

Thus there has been described a new and improved distributed Talbot filter laser that provides for radiation of in-phase energy modes. It is to be understood that the above-described embodiment is merely illustrative of some of the many specific embodiments which represent applications of the principles of the present invention. Clearly, numerous and other arrangements can be readily devised by those skilled in the art without departing from the scope of the invention.

What is claimed is:

1. An improved laser apparatus of the type having an array of surface emitting distributed feedback semiconductor lasers including a semiconductor substrate, a plurality of semiconductor layers disposed on the substrate, a grating etched onto a selected semiconductor material layer, and an output window for allowing output laser radiation produced by the array to exit the laser apparatus, wherein the improvement comprises:

a Talbot spatial filter array disposed adjacent to the grating comprising a plurality of sets of parallel stripe contacts, wherein adjacent parallel sets of parallel stripe contacts are offset from each other by a spacing D, and where each stripe has a length $\bar{n}D^2/\lambda$, wherein $\bar{n}$ is the effective index of refraction and $\lambda$ is the wavelength of the laser radiation in a vacuum.

2. The laser apparatus of claim 1 wherein each stripe contact of the plurality of sets of parallel offset stripe contacts are comprised of diffused zinc.

3. The laser apparatus of claim 1 further comprising phase correction optics disposed along an output path for the output laser radiation for reducing sidelobe energy.

4. The laser apparatus of claim 1 wherein each stripe contact of the plurality sets of parallel stripe contacts has a stripe width selected to increase a near-field fill factor of the laser and thereby reduce sidelobe energy.

5. A laser comprising:
a negatively-doped semiconductor material substrate;
a plurality of semiconductor material layers disposed on the substrate;
a grating etched into a selected semiconductor material layer;
an output window for allowing output laser radiation produced by the laser to exit the laser; and
a Talbot spatial filter array comprising a plurality of sets of parallel stripe contacts disposed over the grating, wherein adjacent parallel sets of parallel stripe contacts are offset from each other by a spacing D, wherein each stripe has a length $\bar{n}D^2/\lambda$, wherein $\bar{n}$ is the effective index of refraction and $\lambda$ is the wavelength of the laser radiation in a vacuum.

6. The laser apparatus of claim 5 wherein each stripe contact of the plurality of sets of parallel offset stripe contacts are comprised of diffused zinc.

7. The laser apparatus of claim 5 further comprising correction optics disposed along an output path of the laser radiation for reducing sidelobe energy.

8. The laser apparatus of claim 5 wherein each stripe contact of the plurality of sets of parallel stripe contacts has a stripe width selected to increase a near-field fill factor of the laser and thereby reduce sidelobe energy.

9. A high energy semiconductor laser comprising:
a semiconductor material substrate;
a plurality of semiconductor material layers disposed on the substrate;
a grating etched into a selected semiconductor material layer;
an output window for allowing output laser radiation produced by the laser to exit the laser; and
a Talbot spatial filter array comprising a plurality of sets of parallel stripe contacts disposed over the grating, wherein adjacent parallel sets of parallel stripe contacts are offset from each other by a spacing D, wherein each stripe has a length $\bar{n}D^2/\lambda$, wherein $\bar{n}$ is the effective index of refraction and $\lambda$ is the wavelength of the laser radiation in a vacuum.

* * * * *